United States Patent [19]

Childers

[11] Patent Number: 4,633,102
[45] Date of Patent: Dec. 30, 1986

[54] HIGH SPEED ADDRESS TRANSITION DETECTOR CIRCUIT FOR DYNAMIC READ/WRITE MEMORY

[75] Inventor: Jimmie D. Childers, Missouri City, Tex.

[73] Assignee: Texas Instruments Incorporated, Dallas, Tex.

[21] Appl. No.: 628,886

[22] Filed: Jul. 9, 1984

[51] Int. Cl.$^4$ ............................ H03K 5/153; G11C 8/00
[52] U.S. Cl. ........................................ 307/354; 307/262; 307/269; 307/480; 365/230
[58] Field of Search ............... 307/354, 262, 527, 479, 307/463, 449, 480, 269, 242; 365/230, 233

[56] References Cited

U.S. PATENT DOCUMENTS 4,286,174  8/1981  Dingwall ........................... 307/242

Primary Examiner—Stanley D. Miller
Assistant Examiner—Richard Roseen
Attorney, Agent, or Firm—John G. Graham

[57] ABSTRACT

A transition of an address input of a memory device is detected in a CMOS circuit having a pair of AND gates Or'ed together. One AND gate receives the input bit and a delayed complement of this bit. The other AND gate receives the complement of the input bit and a delayed version of the true bit. The delays are RC circuits with time constants longer than the transition times. The output of the gates uses a pull-up device to restore a zero level after each transition is indicated. A number of these transition detectors may be OR'ed together to monitor all of the address bits of a memory device.

7 Claims, 2 Drawing Figures

HIGH SPEED ADDRESS TRANSITION DETECTOR CIRCUIT FOR DYNAMIC READ/WRITE MEMORY

BACKGROUND OF THE INVENTION

This invention relates to semiconductor circuits, and more particularly to a CMOS circuit for detecting transitions in an address input.

In semiconductor dynamic read/write memory devices of the type disclosed in U.S. Pat. No. 4,239,993, issued to McAlexander, White, and Rao, for example, it is sometimes desirable to detect the transition of the address bits. When static column decode is employed, a change in the column address will produce a new data output; it is preferable, however, to have an internal indication that an address transition has occurred.

It is the principal object of this invention to provide an improved address transition detector circuit, as may be used in a dynamic read/write memory device, or the like. Another object is to provide a simplified, low-power, CMOS circuit for detecting the change in an address on the input terminal of a memory device.

SUMMARY OF THE INVENTION

In accordance with one embodiment of the invention, a transition of an address input of a memory device is detected in a CMOS circuit having a pair of AND gates OR'ed together. One AND gate receives the input bit and a delayed complement of this bit. The other AND gate receives the complement of the input bit and a delayed true version. The delays are RC circuits with time constants longer than the transition times. The output of the gates uses a pull-up devices to restore a zero level after each transition is indicated. A number of these transition detectors may be OR'ed together to monitor all of the address bits of a memory device.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
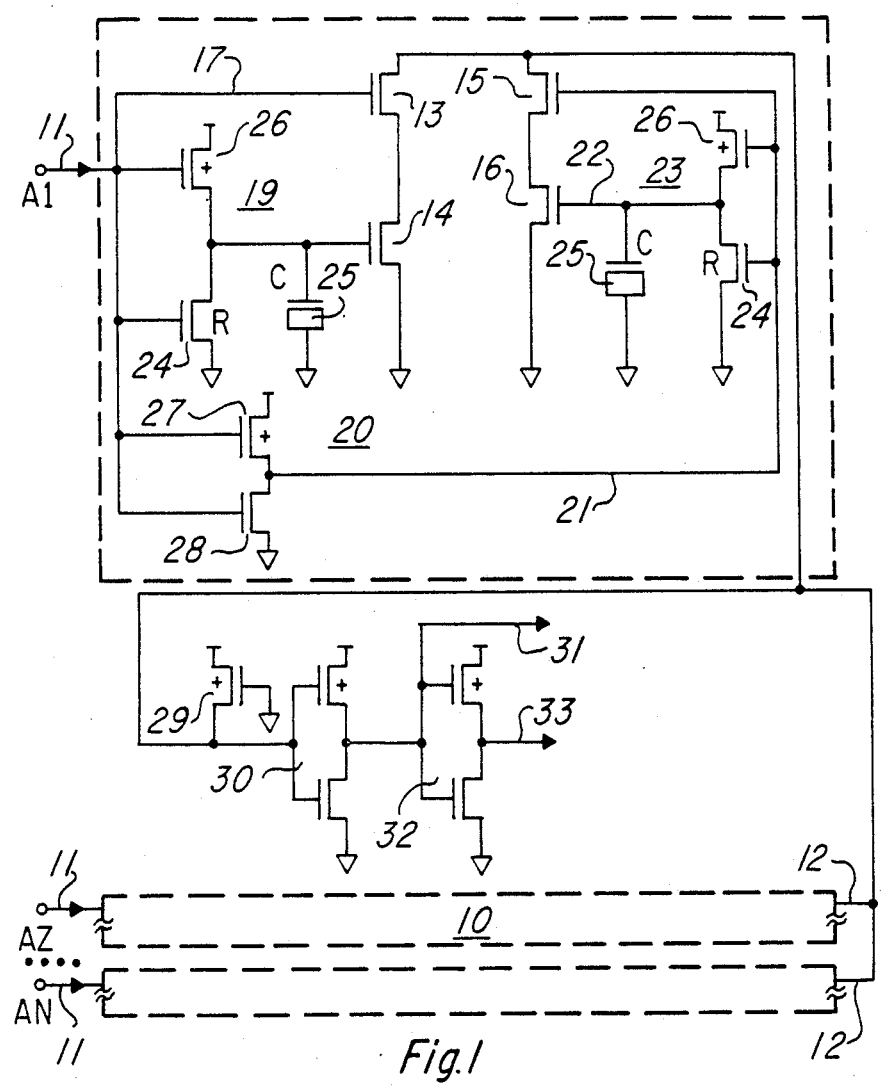
FIG. 1 is an electrical schematic diagram of an address transition detector circuit constructed according to the invention.
Figure 2:
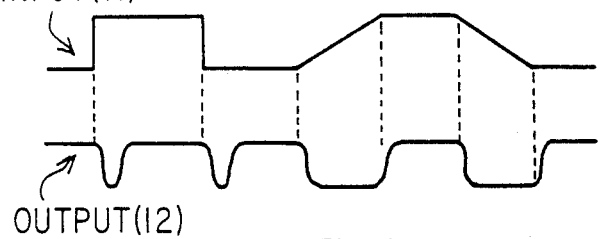
FIG. 2 is a timing diagram showing a plot of voltage vs. time for nodes in the circuit of FIG. 1.

Referring to FIG. 1, a transition detector circuit 10 is shown according to the invention. An address input bit is applied to an input 11 of the circuit 10, and the circuit produces an output on line 12 whenever the voltage on the input 11 makes a transition from 0 to 1, or 1 to 0. The circuit 10 includes an OR logic gate having two pairs of transistors 13 and 14, and 15 and 16 (each pair an AND gate), connected in parallel. The transistor 13 receives the address input bit 11 directly on its gate node 17, while the transistor 14 receives the complement of this bit on its gate node 18 through an inverting delay circuit 19. Likewise, the transistor 15 receives the complement of the address input bit 11 (through an inverter 20) on its gate node 21. The transistor 16 receives the inverted address bit on its gate node 22 through an inverting delay circuit 23. Each of the delay circuits 19 and 23 consists of an RC combination where the resistor R is an N-channel transistor 24, and the capacitor C is a transistor 25 having its source and drain grounded; a P-channel transistor 26 charges the capacitor C quickly from Vdd when its gate is at zero, and the N-channel transistor discharges the capacitor when the input 11 (or 21) goes to 1, at a slower rate dependent upon the size of this transistor. The inverter 20 consists of a P-channel transistor 27 and an N-channel transistor 28.

The output 12 charges to Vdd through a P-channel transistor 29 which functions merely as a pull-up resistor. This output 12 is connected to the input of CMOS inverter 30 which is ratioed to restore a zero level on its output 31. Another inverter 32 provides an output signal on node 33.

In operation of the circuit of FIG. 1, when the input 11 has been at zero for a time (much longer than the RC time constant), the transistor 13 is off, the transistor 26 in delay circuit 19 has charged C, and so transistor 14 is on. On the complement side, the gate 21 is high so the transistor 15 is on, while the transistor 24 in the RC delay 23 has discharged the capacitor C, and transistor 16 is off. Now, assume that the address input bit 11 goes from zero to one in a transition time shorter than the RC time constant. This causes the gate 17 to go high, turning on the transistor 13, and thus discharging the node 12 because the transistor 14 will stay on until the RC delay times out. When output 12 goes low, output 31 goes high, but then the pull-up resistor 29 causes the output 12 to go high again only when transistor 14 turns-off as the RC delay times out and so the output 31 goes low. The magnitude of the resistance of transistor 29 is chosen to cause the output 31 to be restored to a low as soon as there is no completed path to ground for node 12 through transistors 13 and 14 or through transistors 15 and 16.

After the input 11 has been at Vdd for a time much longer than the RC time constant, the delay circuit 19 will have discharged its capacitor C through transitor 24, whereas the delay circuit 23 will have charged its capacitor C through transistor 26 because the node 21 is low. Then, upon a one-to-zero transition of the address input bit the transistors 15 and 16 will both be on and the output 12 discharges as before.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A transition detector circuit comprising:
   an input terminal, and an inverter having an input connected to said input terminal and producing an inverted input;
   an output node, and a pull-up resistance connecting said output node to a voltage supply;
   a first logic circuit having first and second transistors each including a gate and a source-to-drain path, said source-to-drain paths connected in series and the series-connected source-to-drain paths connected between said output node and reference potential; means connecting said gate of the first transistor to said input terminal; and a first delay circuit coupling said gate of the second transistor to said input terminal;

a second logic circuit having third and fourth transistors each including a gate and a source-to-drain path, said source-to-drain paths of the third and fourth transistors connected in series and the series-connected source-to-drain paths connected between said output node and reference potential; means connecting said gate of the third transistor to said inverted input; and a second delay circuit coupling said gate of the fourth transistor to said inverted input, wherein each of said first and second delay circuits comprises a P-channel transistor and an N-channel transistor, each having a source-to-drain path and a gate, the source-to-drain paths being connected in series across a voltage supply, the gates being connected together to input of the respective delay circuit, and juncture of the source-to-drain paths connected to an output of the respective delay circuit and a capacitor connected in parallel with the source-to-drain path of the N-channel transistor.

2. A circuit according to claim 1 wherein each said N-channel transistors has a size selected to provide a resistance for an RC delay, and said capacitors are selected to provide capacitance of such RC delay.

3. A circuit according to claim 1 wherein said first, second, third and fourth transistors are N-channel, and said pull-up resistance is a P-channel transistor.

4. A transition detector circuit for a CMOS memory device or the like, comprising:

an input terminal, and a CMOS inverter having an input connected to said input terminal and producing an inverted input;

an output node, and a P-channel pull-up transistor connecting said output node to a positive voltage supply;

a first logic circuit having first and second N-channel transistors, each of said first and second transistors having a gate and a source-to-drain path, said source-to-drain paths connected in series and the series-connected source-to-drain paths connected between said output node and ground; means connecting said gate of the first transistor to said input terminal; and a first inverting delay circuit connecting the gate of the second transistor to said input terminal;

a second logic circuit having third and fourth N-channel transistors, each of said third and fourth transistors having a gate and a source-to-drain path, said source-to-drain paths connected in series and the series-connected source-to-drain paths of the third and fourth transistors connected between said output node and ground; means connecting said gate of the third transistor to said inverted input; and a second inverting delay circuit connecting said gate of the fourth transistor to said inverted input;

wherein each of said first and second inverting delay circuits comprises a P-channel transistor and an N-channel transistor each having a source-to-drain path and a gate, the source-to-drain paths of said P-channel and N-channel transistors being connected in series across said voltage supply, the gates of said P-channel and N-channel transistors being connected together to input of the respective delay circuit, and juncture of the source-to-drain paths of said P-channel and N-channel transistors being connected to an output of the respective delay circuit and a capacitor connected in parallel with the source-to-drain path of the N-channel transistor.

5. A circuit according to claim 4 wherein each said N-channel transistor has a size selected to provide a resistance for an RC delay, and said capacitors are selected to provide capacitance of such RC delay.

6. A circuit according to claim 4 wherein a plurality of said detector circuits are connected with said output nodes in common;

7. A circuit according to claim 6 wherein address input bits for a memory device are connected to said input terminals of the plurality of detector circuits.

* * * * *